United States Patent
Chang et al.

(10) Patent No.: US 10,373,842 B2
(45) Date of Patent: Aug. 6, 2019

(54) COMPOSITION AND METHOD USED FOR CHEMICAL MECHANICAL PLANARIZATION OF METALS

(71) Applicant: Versum Materials US, LLC, Tempe, AZ (US)

(72) Inventors: Song Y. Chang, Chandler, AZ (US); Mark Evans, Gallipolis, OH (US); Dnyanesh Chandrakant Tamboli, Breinigsville, PA (US); Stephen W. Hymes, Spicewood, TX (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 107 days.

(21) Appl. No.: 14/947,711

(22) Filed: Nov. 20, 2015

(65) Prior Publication Data

US 2016/0079084 A1    Mar. 17, 2016
US 2017/0372918 A9    Dec. 28, 2017

Related U.S. Application Data

(60) Continuation of application No. 12/213,141, filed on Jun. 16, 2008, now abandoned, which is a division of application No. 10/744,285, filed on Dec. 23, 2003, now abandoned.

(60) Provisional application No. 60/437,826, filed on Jan. 3, 2003.

(51) Int. Cl.
*H01L 21/302* (2006.01)
*H01L 21/321* (2006.01)
*C09G 1/02* (2006.01)
*C09K 3/14* (2006.01)
*H01L 21/768* (2006.01)
*B24B 37/04* (2012.01)

(52) U.S. Cl.
CPC ........ *H01L 21/3212* (2013.01); *B24B 37/044* (2013.01); *C09G 1/02* (2013.01); *C09K 3/1463* (2013.01); *H01L 21/7684* (2013.01)

(58) Field of Classification Search
CPC ... H01L 21/7684; H01L 21/3212; C09G 1/02; C09K 3/1463
USPC ............... 438/689–693; 216/38, 52, 53, 83; 252/79.1, 79.2, 79.3
See application file for complete search history.

(56) References Cited

U.S. PATENT DOCUMENTS

| | | | | |
|---|---|---|---|---|
| 6,117,775 A | * | 9/2000 | Kondo | B24B 37/04 257/E21.304 |
| 6,776,810 B1 | * | 8/2004 | Cherian | B24B 37/044 106/3 |
| 7,456,105 B1 | * | 11/2008 | Cooper | C09G 1/02 257/E21.214 |
| 2002/0019202 A1 | * | 2/2002 | Thomas | C09G 1/02 451/57 |
| 2003/0166337 A1 | * | 9/2003 | Wang | C09G 1/02 438/689 |
| 2004/0108302 A1 | * | 6/2004 | Liu | C09G 1/02 216/83 |

(Continued)

*Primary Examiner* — Nadine G Norton
*Assistant Examiner* — Christopher Remavege
(74) *Attorney, Agent, or Firm* — Lina Yang (57) ABSTRACT

Compositions for use in CMP processing and methods of CMP processing. The composition utilizes low levels of particulate material, in combination with at least one amino acid, at least one oxidizer, and water to remove a metal layer such as one containing copper to a stop layer with high selectivity.

20 Claims, 2 Drawing Sheets

(56) References Cited

U.S. PATENT DOCUMENTS

2006/0223320 A1* 10/2006 Cooper ................ B24B 37/044
438/693

* cited by examiner

COMPOSITION AND METHOD USED FOR CHEMICAL MECHANICAL PLANARIZATION OF METALS

CROSS-REFERENCE TO RELATED APPLICATIONS

The present patent application is a continuation application of U.S. patent application Ser. No. 12/213,141 filed on Jun. 16, 2008; which is a divisional application of U.S. patent application Ser. No. 10/744,285 filed on Dec. 23, 2003; which claims the benefit of the filing date of Provisional U.S. Patent Application No. 60/437,826 filed on Jan. 3, 2003. The entire disclosure of Ser. No. 12/213,141 U.S. patent application is incorporated into the present patent application by reference.

FIELD OF THE INVENTION

The invention is directed to compositions for use in planarizing a metal surface applied over a dielectric layer, metal layer, or semi-conductor layer, primarily in connection with the manufacture of integrated circuits. The invention also is directed to methods used in effecting the planarization of the metal surface.

Chemical-mechanical planarization (CMP) is used extensively as a processing step in various planar fabrication technologies, such as in the removal and polishing of dielectric, metal and semi-conductor layers having an uneven or excessively thick topography on a wafer performed in connection with the manufacture of semi-conductors. In the semi-conductor application, CMP can be used to polish dissimilar materials nonselectively, as well as to nonselectively remove single material overburden. CMP can remove different thicknesses of a first layer down to a stop layer of a second material, as well as decrease the thickness of a single layer without reaching a stop layer. A planarized surface allows accurate photolithography to take place more readily. Some of the uses for the CMP process encompass polishing the interconnect areas of the wafer as well as front end and silicon polishing, and it is generally employed each time after successive layers are formed on the wafer. As the name implies, the process involves both a chemical and a mechanical component. Typically, a wafer is mounted on a carrier. Pressure is applied to bring the wafer surface within contact of a polishing pad typically made of a porous or fibrous polymeric material, which is mounted on a platen, and relative motion is initiated between the wafer surface and the polishing pad. At the interface between pad and wafer a liquid is supplied which facilitates the removal of material on the surface of the wafer. The liquid may, but is not required to, contain an abrasive component which contributes to the removal action at the pad-wafer interface during the planarization procedure.

The liquid can also contribute to controlling the removal of material from the wafer by incorporating components which interact chemically with the metal layer on the surface of the wafer. The chemical action generally takes one of two forms. In the first, components in the liquid react with exposed metal on the surface of the metal layer to create an oxide layer. Oxide layer formation typically involves the addition to the liquid of an oxidizer such as hydrogen peroxide, which typically but not necessarily is combined with the other components of the liquid just prior to use. The oxide layer formed thereby is then removed by the mechanical action of a pad or an abrasive component in the liquid. In the second, the surface is converted by components in the liquid which become adsorbed onto the surface. In both instances, the chemical action passivates the surface.

In addition, the liquid may contain one or more components which directly act to dissolve abraded material. The components operate preferably to dissolve particles after they have been abraded from the wafer surface. Generally, it is not desired for the dissolution process to occur on the surface of the wafer.

Where the CMP liquid is formulated to contain an oxidizer, the oxidizer component may be added just prior to actual use on the wafer to maximize the working time of the liquid if incorporation of the oxidizer would tend to destabilize the formulation or any of the components of the formulation. However, the oxidizer-containing CMP liquid can also be prepared some time before use if a non-destabilizing oxidizer can be incorporated.

Regardless of whether an abrasive is used in the CMP liquid, the liquid may need to undergo a pH adjustment, for example where a high zeta potential is attainable to retain colloidal stability. It is undesirable in an abrasive-containing liquid for the particles to settle out of the suspension. Electrical charges surrounding the interface between the particle and the liquid strongly influence the stability of the colloidal system. The zeta potential measures the potential of a particle's surface at its shear plane and provides a general measure of the stability of a colloidal system. To maintain a stable colloidal system, a high zeta potential of either positive or negative charge is desired. The zeta potential of the particular particle decreases to zero at the pH corresponding to its isoelectric point. Thus, to enhance the stability of the colloid, the pH of the system should differ from the pH at the isoelectric point. For example, the isoelectric point of a silica slurry is at a pH of 2; preferably, then, the silica slurry is maintained at an alkaline pH to enhance the colloidal stability. In contrast, the isoelectric point of an alumina slurry is at a pH of 8; it is preferred to maintain this slurry at an acidic pH to enhance colloidal stability. Other variables which affect the colloidal stability of a particulate system include particle density, particle size, particle concentration, and chemical environment.

The abrasive assists in facilitating the replenishment of fresh wafer surface which can then be further attacked by any of the oxidizing, chelating and etching components of the liquid. Nonetheless, the use of an abrasive component in the CMP liquid can produce undesired results on the wafer surface. The abrasive can create micro-scratches on any exposed surface of the wafer resulting in a non optically-flat surface. For example, these micro-scratches can lead to a defect in later processing whereby a thin metal line is trapped within the dielectric, causing shorts between adjacent metal lines or vias. Also, formation of topography creates preferential sites for subsequent particle adhesion. Further, residual particles of the abrasive can cause potential opens or shorts depending on the electrical nature of the particle.

The surface of the wafer contains materials having differing resistances to the effect of abrasive action. As a result, exposing the wafer surface to the mechanical action of the rotating pad in the presence of abrasive causes certain regions of the wafer surface to be more quickly removed than others, creating surface anomalies and a varying topography. For example, in the case of copper deposited on a dielectric, the planarization process can cause the copper to recede below the level of the adjacent dielectric. This effect on the wafer surface is known as dishing. It is believed that etching of the metal surface of the wafer is one of the factors which contributes to undesired dishing. Etching is the nonselective removal of metal from the surface of a layer, which tends to both roughen the resultant surface and create a nonplanar surface. Where an array of copper metal lines is located on a wafer substrate, the mechanical action of the rotating pad in the presence of abrasive tends to cause formation of individual recesses of copper which in turn results in a high polishing rate of the adjacent dielectric. This thinning of the dielectric in the array relative to dielectric outside the array is known as erosion.

BRIEF SUMMARY OF THE INVENTION

The present invention is directed to a composition for use in chemical mechanical planarization which facilitates the removal of metal from the wafer without significantly contributing to the undesirable polishing effects attributable to an abrasive component. The invention also relates to a method of chemical mechanical planarization utilizing the composition described above. It is an object of the invention to provide a CMP composition which provides for tunable metal removal rates, such as for copper. It is a further object of the invention to provide a CMP composition capable of being produced in a reduced water content form while retaining high particle stability. It is a further object of the invention to provide a CMP composition which produces a highly uniform metal surface on the wafer with low susceptibility to dishing and erosion. It is yet a further object of the invention to provide a method of effecting planarization and removal of a wafer surface while minimizing formation of micro-scratches onto the metal surface of the wafer. It is yet a further object of the invention to provide a CMP composition which can produce a highly planarized surface on the wafer over a range of operating pH values. It is yet a further object of the invention to provide a CMP composition having a low defectivity response.

The composition attains rates of removal on the order of compositions having appreciable concentrations of abrasive material using substantially non-abrasive chemistry. The invention provides a CMP composition comprising the following components:

(a) an oxidizing agent;
(b) an amino acid;
(c) particulate material in a concentration range at a level below which any significant abrasive effects attributable to the particulate material are observed; and
(d) water.

Though the particles incorporated into the CMP composition are present at a level below which any significant abrasive effects attributable to the particles are observed, rates of copper metal removal comparable to that of highly loaded abrasive-containing systems are obtained. Typically the amount of particles in the formulation is less than about 1000 ppm by weight of the formulation, and more narrowly in the range of about 5 ppm to about 100 ppm. The particle concentration in the formulation can be higher, however, up to about 4000 ppm, as long as the ratio of copper rate of removal (RR) relative to the stop layer rate of removal (RR), i.e., the selectivity, is at least 50:1, more narrowly at least 100:1, and most narrowly at least 300:1. As used herein, reference to copper is meant to encompass materials having copper as a component, including but not limited to pure copper metal and copper alloys. Reference to a stop layer is meant to encompass materials having tantalum as a component, including but not limited to pure tantalum metal, tantalum nitride, tantalum carbide, and other tantalum alloys, including tertiary and quaternary materials containing tantalum. In addition, reference to a stop layer is also intended to encompass materials such as other refractory metals, other noble metals, and transition metals and alloys which have a substantially reduced removal rate relative to copper in the presence of the formulations recited herein for planarizing the wafer surface. The stop layer may also include silicon dioxide and other materials which operate as a dielectric layer. Optionally, a corrosion inhibitor can also be incorporated into the composition.

Because the stop layers, i.e., the dielectric and barrier layers, generally require abrasives to be removed, the low-particle concentration composition promotes selectivity. The composition in the absence of any appreciable amount of particulate material for the purpose of providing mechanical polishing facilitates removal of the copper layer from the wafer without significant removal of the stop layer. The low-particle concentration composition also tends to have longer shelf stability. Further, because the composition contains a generally lower concentration of non-aqueous components, the composition can be more easily concentrated. This capability more readily permits the composition to be prepared and shipped in a concentrate form, avoiding the need to ship water to the purchaser.

The composition also provides a low defectivity response. Wafers treated using the compositions exhibit low surface roughness. Further, corrosion effects, including but not limited to interfacial corrosion between the barrier and copper layers, and copper corrosion involving the grain structure, are low. Micro-scratching is also maintained at minimum levels. Also, the presence of residual particles on the wafer surface is minimized by use of the composition.

Additional objectives and advantages of the invention will be set forth in the description which follows, and in part will be understood from the description, or may be learned by practice of the invention.

BRIEF DESCRIPTION OF SEVERAL VIEWS OF THE DRAWINGS

The accompanying drawings are incorporated herein and constitute part of the specification. These drawings illustrate embodiments of the invention and, in conjunction with the description provided herein, serve to explain the principles of the invention.

DETAILED DESCRIPTION OF THE INVENTION

In its broader aspects the invention is directed to a composition for use in planarizing a metal film on a wafer comprising an oxidizing agent, an amino acid, particulate material in a concentration range below which any significant abrasive effects attributable to the particulate material are observed, and water. The particle concentration usable to facilitate removal of copper without significant removal of the stop layer is equal to or less than about 4000 ppm. Typically the particle concentration in the composition is about 5 ppm to less than 1000 ppm by weight, more narrowly between about 5 ppm and about 700 ppm, still more narrowly between about 5 ppm and about 400 ppm, and most narrowly between about 5 ppm and about 100 ppm. It has been found that the use in the composition of very low concentrations of particles, up to a weight percentage which is below a level wherein the particles could provide any negative observable abrasive effect traditionally associated with higher abrasive concentration formulas, such as micro-scratching, selectivity loss or dishing, provides beneficial effects in copper layer removal from the wafer surface.

The particle size range of the particles used in the composition should generally be on the order of about 4 to about 10,000 nm, and more narrowly about 4 nm to about 1,000 nm. Most narrowly the particle size falls in the range of about 4 nm to about 400 nm. The effect provided by the particles is generally not dependent on particle size. However, improved copper removal rates are observed with colloidal silica particles in the particle size range of about 4 to 400 nm, and fumed silica with a particle size in the range of about 40 to about 400 nm.

Other particles in addition to colloidal silica have utility in the composition and method of planarizing. Generally, a wide range of compositions can be used with good effect. Further, the particles can be obtained through a variety of manufacturing and processing techniques, including but not limited to thermal processes, solution growth processes, mining of raw ore and grinding to size, and rapid thermal decomposition. The materials can be incorporated into the composition generally as supplied by the manufacturer. Certain of the particulate materials usable in the composition have been previously incorporated into CMP slurries at higher concentrations as abrasive materials. However, other particulate materials which have not traditionally been used as abrasives in CMP slurries can also be used to provide advantageous results. Representative particulate compositions include a variety of inorganic and organic materials which are inert under the use conditions of the composition of the invention, such as fumed silica, colloidal silica, fumed alumina, colloidal alumina, cerium oxide, titanium dioxide, zirconium oxide, polystyrene, polymethyl methacrylate, mica, hydrated aluminum silicate, and mixtures thereof. The particles have particle sizes ranging from about 4 nm to about 10,000 nm, more narrowly from about 4 nm to about 1,000 nm, and most narrowly from about 4 nm to about 400 nm. The particles may exist in a variety of physical forms, such as but not limited to platelet, fractal aggregate and spherical species.

Colloidal silica is one particulate material which is commercially available as a pre-dispersion in liquid media, typically water. Other particulate materials are also available commercially as pre-dispersions in the same or different liquid media. The pre-dispersion contains a stabilizer which supplies counter ions to charge the colloid surface and thereby improve the colloidal stability. Stabilizers are used in preparing pre-dispersions for a variety of particulate materials.

Electric diffusion factors tend to limit the nature of ions which can be used to charge the colloid surface for applications in semi-conductor manufacture. Non-limiting examples of materials for contributing counter ions include ammonium hydroxide, potassium hydroxide, hydrochloric acid, nitric acid and organic acids. The concentration range of materials contributing counter ions in the particle formula varies as a function of the desired pH of the formula as well as the particle size of the particulate material, with higher counter ion concentration generally required for formulations incorporating smaller size particles. Non-limiting factors which promote colloidal stability are pH values sufficiently distinct from the pH at the isoelectric point, and a low particle concentration in the liquid.

Optionally, the formulation can incorporate a corrosion inhibitor, which limits metal corrosion and etching during the CMP process. The corrosion inhibitor forms a protective film on the metal surface by either physical adsorption or chemical adsorption. The corrosion inhibitor is incorporated at a concentration level in the range of about 10 ppm to about 20,000 ppm by weight, more narrowly about 20 ppm to about 10,000 ppm by weight, and most narrowly about 50 ppm to about 1000 ppm by weight. The corrosion inhibitor operates to protect the copper surface from the effects of etching and corrosion during the CMP process. One preferred material is 1,2,4-triazole. Other materials which may be incorporated as corrosion inhibitors include but are not limited to nitrogenous cyclic compounds such as 1,2,3-triazole, 1,2,3-benzotriazole, 5-methylbenzotriazole, benzotriazole, 1-hydroxybenzotriazole, 4-hydroxybenzotriazole, 4-amino-4H-1,2,4-triazole, and benzimidazole. Benzothiazoles such as 2,1,3-benzothiadiazole, triazinethiol, triazinedithiol, and triazinetrithiol can also be used.

The oxidizing agent facilitates conversion of copper on the wafer surface to hydrated copper compounds of either CuOH, Cu(OH)2, CuO, or Cu2O. The oxidizer can be hydrogen peroxide, but may be any of a number of materials which perform an oxidizing function, such as but not limited to ammonium dichromate, ammonium perchlorate, ammonium persulfate, benzoyl peroxide, bromates, calcium hypochlorite, ceric sulfate, chlorates, chromium trioxide, ferric trioxide, ferric chloride, iodates, iodine, magnesium perchlorate, magnesium dioxide, nitrates, periodic acid, permanganic acid, potassium dichromate, potassium ferricyanide, potassium permanganate, potassium persulfate, sodium bismuthate, sodium chlorite, sodium dichromate, sodium nitrite, sodium perborate, sulfates, peracetic acid, urea-hydrogen peroxide, perchloric acid, di-t-butyl peroxide, monopersulfates and dipersulfates. Preferably the oxidizing agent is incorporated into the formulation on site at the time of use or shortly prior thereto. It is also possible to incorporate the oxidizing agent at the time of combining the other components, though stability of the thus-formed composition over longer storage conditions must be taken into consideration. The oxidizing agent is incorporated at a concentration level in the range of about 0.1% to about 20% by weight, more narrowly about 0.25% to about 5% by weight.

At least one amino acid is incorporated into the formulation. The presence of amino acid in the formulation has been found to affect the rate of copper removal during the CMP process. However, increased amino acid levels increase the etching rate of the copper, which is undesirable. Concentration levels are therefore adjusted to achieve an acceptable balance between copper rate of removal and the etching rate. Typically, the concentration of the amino acid is within the range of about 0.05% to about 5% by weight, and more narrowly between about 0.25% and about 2% by weight.

A variety of amino acids can be used in the preparation of the CMP formulation. Good results have been obtained using aminoacetic acid, also known as glycine. Other representative amino acids which can be used in the composition include but are not limited to serine, lysine, glutamine, L-alanine, DL-alanine, iminoacetic acid, asparagine, aspartic acid, valine, sarcosine, and mixtures thereof.

Typically, water constitutes a major weight percentage of the formulation. Generally, water which is acceptable in preparing formulations will not adversely affect the CMP processing, and will neither adversely affect the stability of the formulation nor the surface of the wafer subjected to the CMP processing. Typically, deionized water is used in preparing the formulation, though distilled water or reverse osmosis water may also be used.

The individual formulations described herein can be prepared from a single oxidizing agent, amino acid, particulate material, water source and optional additive such as a corrosion inhibitor. However, the formulation can also incorporate mixtures of each or all of these components with good effect.

As an alternative to the inventive formulations, the rate of removal for copper could be increased by incorporating abrasives into a CMP formulation. Nonetheless, a high abrasive loading in the formulation can create microscratches, leave residual abrasive or metal particles on the metal, and promote dishing and erosion on the wafer surface. The incorporation of both very low levels of particles and lowered levels of an amino acid in place of high abrasive loadings or an elevated amino acid concentration provide an improved rate of removal of the copper layer while at the same time avoiding the disadvantages attributed to high abrasive loading and the copper etching associated with elevated levels of the amino acid. The ability to produce a composition which attains rates of removal comparable to highly loaded abrasive-containing compositions but having a low concentration of amino acid and particle relative to highly loaded abrasive-containing compositions more readily permits delivery of a concentrated form of the composition to the customer.

For formulations containing higher levels of particulates, maintaining colloidal stability generally requires that the pH be brought to within a narrow range. However, to control the polish rate or static etch rate of the formulation in a CMP process, the pH may preferably need to be set at a different value which is not consistent with maintaining optimum colloidal stability. The low particulate concentration in the inventive formulations diminishes the requirement for operating within a particular pH range to optimize colloidal stability, and thereby permits more flexibility in controlling the polish rate and static etch rate.

The composition of the invention can be employed in CMP processing equipment without modification of the equipment or the process methodology. The process and equipment described below is exemplary; however, variations of the process and equipment have been used which can also employ the composition of the invention.

Figure 1:
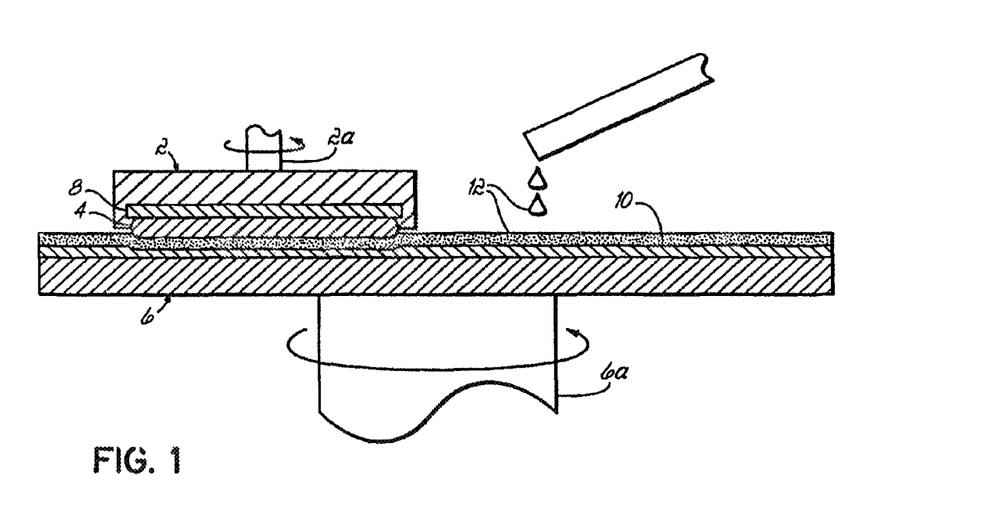
FIG. 1 is a schematic view of processing equipment which can be used in connection with chemical mechanical planarization.

In referring to FIG. 1, the CMP procedure for polishing a wafer in commercial practice utilizes a chuck, or carrier 2, which holds the wafer 4 in position relative to a polishing table, also known as a platen 6. This particular arrangement of polishing and holding devices is known as the hard-platen design. In this arrangement the wafer surface to be polished is secured in the carrier 2 which holds the wafer 4 in a generally horizontal orientation, the surface to be polished facing down. The carrier 2 may retain a carrier pad 8 which lies between the retaining surface of the carrier 2 and the surface of the wafer 4 which is not being polished. This pad 8 can operate as a cushion for the wafer 4, though alternate cushioning materials can be utilized.

Below the carrier is a larger diameter platen 6, which is also oriented generally horizontally, presenting a surface parallel to that of the wafer to be polished. The platen 6 is fitted with a polishing pad 10 which contacts the wafer surface during the planarization process. Polishing is facilitated by a polishing composition 12 which is generally applied onto the polishing pad 10 as a stream or in a dropwise fashion. This composition 12 supplies materials which assist in removing particles from the surface, and acts as a medium for the convective transport of polish byproducts to be removed from the vicinity of the wafer surface.

After the wafer 4 secured into the carrier 2 is aligned relative to the polishing pad 10 on the platen 6, both the carrier 2 and the platen 6 are caused to rotate around respective shafts 2A and 6A extending perpendicularly from the carrier and platen. The parallel relationship between wafer surface and polishing pad is maintained throughout the process. The rotating carrier shaft 2A may remain fixed in position relative to the rotating platen 6, or may oscillate horizontally relative to the platen 6. Polishing composition 12 is continuously supplied during the planarization process as either a stream or dropwise. The direction of rotation of the carrier 2 containing the secured wafer 4 typically, though not necessarily, is the same as that of the platen 6. The speeds of rotation for the carrier 2 and platen 6 are generally, though not necessarily, set at different values. Generally, the carrier 2 rotates at about 30 rpm, while the platen 6 rotates at about 90 rpm. In practice, the carrier rotates over a range of speeds from 0 to 120 rpm, and the platen rotates over a range of speeds from 0 to 150 rpm.

The rate of removal of material on the surface of the wafer 4 varies as a function of the pressure, or downforce, exerted on the wafer surface by the respective proximity of the carrier 2 to the platen 6, and the rotational speeds of the carrier 2 and platen 6. Generally, the pressure exerted on the wafer surface being polished is in the range of about 0 to 10 psi, with a typical pressure of about 2.8 psi. Depending on the composition and thickness of the material being removed by the planarization procedure, the time required to complete one planarization routine for a single wafer is on the order of 1 to about 10 minutes.

Factors which may influence the planarization process include among others the wafer downforce, platen speed, pad structure, pad conditioning, the chemistry of the polishing composition, and the composition supply rate. Planarization is maximized by employing minimum downforce and high relative rotation speed. Wafer surface removal rate is maximized by increasing the downforce and table speed.

EXAMPLES

The following detailed examples illustrate the practice of the invention in its most preferred form, thereby enabling a person of ordinary skill in the art to practice the invention. The principles of this invention, its operating parameters and other obvious modifications can be understood in view of the following detailed procedures.

Example 1

The rates of removal for several materials on a wafer surface were evaluated using several formulations. The testing apparatus was an IPEC 472 unit from SpeedFam-IPEC Corporation, Phoenix, Ariz. The 22.5 inch (57.21 cm) diameter table was fitted with a pre-stacked K-grooved IC 1000/SBA IV polishing pad from Rode Corp., Phoenix, Ariz. 85034. The table was rotated relative to a smaller diameter rotating carrier to which the 200 mm wafer was attached. Both the table, also known as the platen, and the carrier rotated in the same direction, but at different speeds. Polishing formulation was deposited onto the polishing pad and thereby conveyed by relative movement of the rotating pad to the carrier into contact with the wafer surface.

Several sets of process parameters were utilized during the course of evaluating various formulations for their ability to remove material from the wafer surface. The process parameters can affect the copper removal rate and the parameters for each evaluation are therefore set out herein. The process parameters utilized on the test apparatus for the first example are set out below; as used in other examples these parameters are identified as OP-I herein. Potential sources of possible removal rate variation, such as the condition of the polishing pad and pad conditioner, were also maintained in a generally constant state, as possible.

OP-I

Down Force on the Carrier: 3 psi
Backfill Pressure on the wafer: 2 psi
Platen Speed: 90 rpm
Carrier Speed: 30 rpm
Pad Type: IC 1000 S-IV (Rode Inc., Phoenix Ariz. 85034)
Pad Conditioning 1591 g. 5.08 cm (Morgan Advanced Ceramics Inc., Diamine Division, Allentown, Pa.), 75μ grid pad, in situ
Slurry Flow Rate: 200 ml/min Four different wafers were used in the tests, each with an eight inch (20.3 cm) diameter. The wafers were:
Cu Blanket Film (Wafered Inc., San Jose, Calif.)
Ta Blanket Film (Wafered Inc., San Jose, Calif.)
$SiO_2$ Blanket Film (Wafered Inc., San Jose, Calif.)
854AZ Patterned Film (International SEMATECH, Austin, Tex.)

To evaluate the effect of low concentrations of colloidal silica particles on the copper removing ability of the formulation, aqueous solutions were prepared according to the following compositions listed below. Unless otherwise indicated, all concentrations herein are listed by weight percent. Unless otherwise noted herein, hydrogen peroxide was introduced into the formulations as a 30% solution by weight in water. Also, 1,2,4-triazole was introduced as a 33% by weight solution in water, this solution being commercially available from Ashland Specialty Chemical Co. Unless otherwise noted, the amounts of component materials in the tables listed below are provided on a 100% actives basis.

TABLE 1

| Component | Formula | Formula 2 |
|---|---|---|
| $H_2O_2$ | 1% | 1% |
| Aminoacetic Acid | 1% | 1% |
| 1,2,4-Triazole | 500 | 500 ppm |
| $SiO_2$ | 0.0% | 0.1% |
| Deionized Water | Balance | Balance |

Test solutions were prepared by dissolving the desired amount of aminoacetic acid and 1,2,4-triazole in deionized water in an open container. To the test solution was added the desired amount of colloidal silica having a pH of 9 and 84 nm particle size. The colloidal silica was from W.R. Grace with ammonium hydroxide stabilization. The colloidal silica is in the form of a suspension having a solids content of 48% by weight silica with the remainder being water and ammonia, based upon the total weight of the suspension. The specific gravity of the suspension is 1.35. The solution containing colloidal silica was homogenized by physical agitation using a stirring rod for several minutes before adding $H_2O_2$ as the oxidizer.

Generally, the particle size data supplied herein was provided by the manufacturer of the particulate material. In instances where the particulate material was supplied in the form of a powder, particle size was measured using an Accusizer 788/388 ASP device from Particle Sizing System, Santa Barbara, Calif. Mean particle size and particle size distribution is measured in this device by registering the scattering intensity from dispersed particles at a 90 degree angle and then performing an autocorrelation analysis to yield the mean particle size and particle size distribution. The Accusizer 788/388 device features an autodilution chamber, a solid-state He/Ne laser and a 128-channel photon correlator. The device dilutes the injected sample to a proper concentration, then selects the proper channel width to record photons scattered from the sample. The autocorrelation period is ten minutes. Mean particle size and particle size distribution can be generated on the basis of intensity average, volume average and number average; intensity average is reported and the measured particulate materials are reported herein by mean particle size.

Formula 3 was prepared by blending formulas 1 and 2 from Table 1 in varying amounts. Thus, formula 3 was prepared by mixing 200 parts by volume of formula 2 with 1500 parts by volume of formula 1 into a container.

Table 1A sets out the composition of formula 3.

TABLE 1A

| Component | Formula 3 |
|---|---|
| $H_2O_2$ | 1% |
| Aminoacetic Acid | 1% |
| 1,2,4-Triazole | 500 ppm |
| $SiO_2$ | 0.012% |
| Deionized Water | Balance |

The electroplated copper, physical vapor-deposited tantalum and chemical vapor-deposited TEOS-grown silicon dioxide blanket film wafers were then subjected to the CMP process using OP-I for a one minute polish period. The respective film removal rates for each of the three wafers were measured using a Tencor RS35c 4-point probe for the copper and tantalum metal films and a Philips SD 2000 ellipsometer for the TEOS film.

The rate of removal value was determined by measuring the thickness difference of the tested wafer from pre to post-polish. The thickness of the metal film, T, was measured by applying the equation $T \times R$=resistivity coefficient, wherein T is the film thickness in A and R is the sheet resistance in C2/0. The sheet resistance was measured using a Tencor RS35c 4-point probe, KLA-Tencor Corporation, San Jose, Calif. The resistivity coefficient is a constant for a particular metal film but not for all films of the same metal. In the instant case for a pure thin copper film, the resistivity coefficient used was 1.8μ 0-cm. For a pure thin tantalum film, the resistivity coefficient used was 177μ a-cm. The thickness of the $SiO2$ dielectric film was determined using a Philips Analytical, Natick, Mass., SD-2000 dual wavelength ellipsometer with an index of refraction, n, of 1.47 at 632.8 nm and 1.45 at 1540 nm.

In evaluating metal film thickness, the film was measured for sheet resistance to determine initial thickness using the equation above, after which the film was polished using a CMP protocol for one minute. After the polish step the wafer was cleaned by spin rinsing and drying, and the sheet resistance was measured again, to calculate the residual thickness. The amount of film removed was then determined by calculating the difference in thickness before and after the polish step.

The Tencor 4-point probe was also used for determining the metal static etch rate (SER). The static etch rate for a particular formula compared with the rate of removal for the same metal provides a measure of the formula's ability to facilitate metal polishing without undesirable metal removal via etching. Square wafer pieces nominally about 3.3 cm on each side were measured for thickness with the Tencor RS35c probe prior to etching. The pieces were then suspended by a sample holder in a 250 ml beaker. To the beaker was then added the test solution which covered the suspended wafer piece. The solution was agitated using a magnetic stirrer operating at about 125 rpm during the etch period, nominally 20 minutes at room temperature. To get accurate rate results, at least about 300 A of material from the surface should be removed.

After the etch period was completed, the wafer pieces were removed, washed in deionized water, and blown dry using compressed air or nitrogen. The amount of material removed was then determined by subtracting the pre-measurement average film thickness from the post-measurement average film thickness.

Tantalum rate of removal was determined in the same manner as for copper rate of removal. SiO2 rate of removal was determined by use of the Philips SD 2000 ellipsometer.

silica removed about the same amount of tantalum as the base formula containing no colloidal silica. SiO2 removal was effectively zero for all formulas.

The copper to stop layer selectivity, in this instance for tantalum, was determined by comparing the rate of removal of copper relative to that of tantalum for each of the formulas where both copper and tantalum rates of removal were determined. In addition, the static etch rates for copper generated for formulas 1 and 2 were measured and were found to be very low when compared to the copper rate of removal. The rate of removal of copper relative to the static etch rate for copper was determined for formulas 1 and 2. A high ratio of removal rate to etch rate is preferred. The ratios are provided in Table 2A below.

TABLE 2A

| Formula | Cu/Ta RR | Cu RR/Cu |
|---------|----------|----------|
| 1 | 24.1 | 6.2 |
| 2 | 650.9 | 131.2 |
| 3 | 553.8 | — |

Thus, high Cu:Ta selectivities were obtained using formulas 2 and 3 while still maintaining a relatively low etch rate. Also, high Cu RR/Cu SER performance was achieved by formula 2.

TABLE 3

| Component | Formula 4 | Formula 5 | Formula 6 | Formula 7 | Formula 8 | Formula 9 | Formula 10 | Formula 11 |
|-----------|-----------|-----------|-----------|-----------|-----------|-----------|------------|------------|
| 1% $H_2O_2$ (by volume) | 95 | 90 | 85 | 80 | 75 | 65 | 50 | 25 |
| Formula 2 (by volume) | 5 | 10 | 15 | 20 | 25 | 35 | 50 | 75 |
| Colloidal Silica Content (ppm) | 50 | 100 | 150 | 200 | 250 | 350 | 500 | 750 |
| Aminoacetic Acid Content (ppm) | 500 | 1000 | 1500 | 2000 | 2500 | 3500 | 5000 | 7500 |
| 1,2,4-Triazole Content (ppm) | 25 | 50 | 75 | 100 | 125 | 175 | 250 | 375 |
| Total $H_2O_2$ Content (ppm) | 10,000 | 10,000 | 10,000 | 10,000 | 10,000 | 10,000 | 10,000 | 10,000 |

The results showing film removal rates of all films and etching rate of copper are set out below in Table 2. Listed results for all film removal rates herein were taken as an average of 49 points across the diameters of 2 wafers, the average thus being based on 98 data points. Listed results for all static etch rates were taken as an average of 9 measurements across the sample piece.

TABLE 2

| Formula No. | SER (Å/Min) | Ta RR (Å/Min) | $SiO_2$ RR (Å/Min) | Cu RR (Å/Min) |
|-------------|-------------|---------------|---------------------|----------------|
| 1 | 54.3 | 14 | 3 | 337 |
| 2 | 63.0 | 12.7 | 0 | 8266 |
| 3 | * | <15 | 0 | 8307 |

*Test was not performed

The results demonstrate the substantial improvement in copper removal rate by the addition of very small amounts of colloidal silica. Formula 3 containing only 0.012% colloidal silica produced a copper removal rate more than 24 times greater than formula 1, which was identical in all respects except for the presence of colloidal silica. Higher amounts of colloidal silica incorporated into the formula, as shown in formula 2, provided comparable copper and tantalum removal rate results to that found with formula 3. The tantalum rate of removal was considered to be insignificant, and it can be seen that the formulas containing colloidal Additional formulas having varying concentrations of particulate material, amino acid and corrosion inhibitor components were produced by mixing formula 2 from Table 1 above with a 1% (by weight) $H_2O_2$ solution at varying relative concentrations into an open container at room temperature. The following formulas 4 through 11 have the compositions as set out in Table 3 below. The relative amounts of formula 2 and the $H_2O_2$ solution were incorporated into the listed formulas on a percent volume basis. Table 3 also provides the effective resulting concentration of oxidizing agent, amino acid, corrosion inhibitor and particulate material for the various formulas.

CMP applications were conducted on each of the copper, tantalum and SiO2 blanket wafers using the above described IPEC 472 platform and the OP-I CMP protocol described in Example 1 using formulas 4 through 11 for a one minute run time. For each formula, the rate of removal results for copper, tantalum and SiO2, as well as the copper to tantalum selectivity ratio are set out in Table 4 below. The rate of removal measurement set out above was used.

TABLE 4

| Formula No. | Cu RR (Å/Min) | Ta RR (Å/Min) | TEOS RR (Å/Min) | Cu/Ta RR | Colloidal Silica Content (ppm) |
|-------------|----------------|----------------|------------------|----------|-------------------------------|
| 4 | 622 | 9 | 0 | 69.1 | 50 |
| 5 | 1269 | 9 | 22 | 141 | 100 |

TABLE 4-continued

| Formula No. | Cu RR (Å/Min) | Ta RR (Å/Min) | TEOS RR (Å/Min) | Cu/Ta RR | Colloidal Silica Content (ppm) |
|---|---|---|---|---|---|
| 6 | 2965 | 5 | 0 | 593 | 150 |
| 7 | 2791 | 13 | 0 | 214.7 | 200 |
| 8 | 2951 | 9 | 0 | 327.9 | 250 |
| 9 | 4535 | 13 | 27 | 348.8 | 350 |
| 10 | 5848 | 12 | 28 | 487.3 | 500 |
| 11 | 6790 | 18 | 3 | 377.2 | 750 |

As the results in Table 4 indicate, the rate of removal of tantalum and SiO2 remains low for all formulas. The rate of removal of copper, on the other hand varied from 622 Å/Min to 6790 Å/Min. Thus, the rate of removal of copper can be rendered tunable relative to the tantalum and SiO2 removal rate.

Two compositions were also tested for their ability to provide satisfactory planarization performance with minimum topography. Formula 2 as prepared above was used to planarize an 8" SEMATECH 854AZ patterned wafer, which was evaluated for dishing effects on an isolated 100 tan wide line and for erosion effects on a 9 μm by 1 μm, 90% metal density array. Planarization was conducted using CMP protocol OP-II which varied from OP-I in several respects. The OP-II protocol is set out below.

OP-II

Down Force on the Carrier: 2 psi

Backfill Pressure on the wafer: 1 psi

Platen Speed: 120 rpm

Carrier Speed: 30 rpm

Pad Type: IC 1000 S-IV (Rode Inc., Phoenix Ariz. 85034)

Pad Conditioning 1591 g. 5.08 cm (Morgan Advanced Ceramics Inc., Diamine Division, Allentown, Pa.), 75μ grid pad, in situ Slurry Flow Rate: 200 ml/min The patterned wafer was subsequently analyzed for dishing and erosion effects by measuring the step height magnitude of such structures on the 854AZ patterned wafer after each polishing step, using a Tencor P2 profiler from KLA-Tencor Corporation. The dishing on isolated 100 tan wide lines from the center, mid radius and edge die of the SEMATECH 854AZ patterned wafer was characterized. Further, the erosion on a 9 μm by 1 tim, 90% metal density array from the center, mid radius and edge die of the patterned wafer was characterized.

Figure 2:
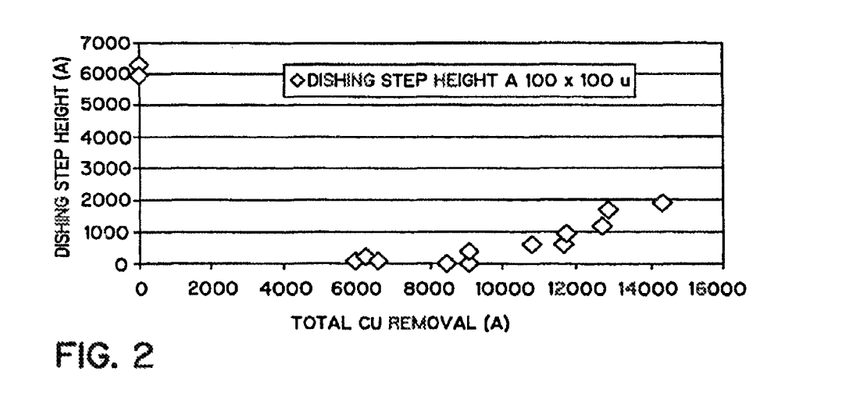
FIG. 2 is a graph of dishing step height relative to total copper removal for a particular CMP composition.

Data generated using formula 2 for the cumulative total amount of copper removed on an equivalent die location basis on blanket copper films polished under identical conditions as for each patterned wafer polish and the dishing step height magnitude at center, mid radius and edge die locations for the dishing evaluation are set out in Table 5. The data points were used to generate the graph as shown in FIG. 2.

Figure 3:
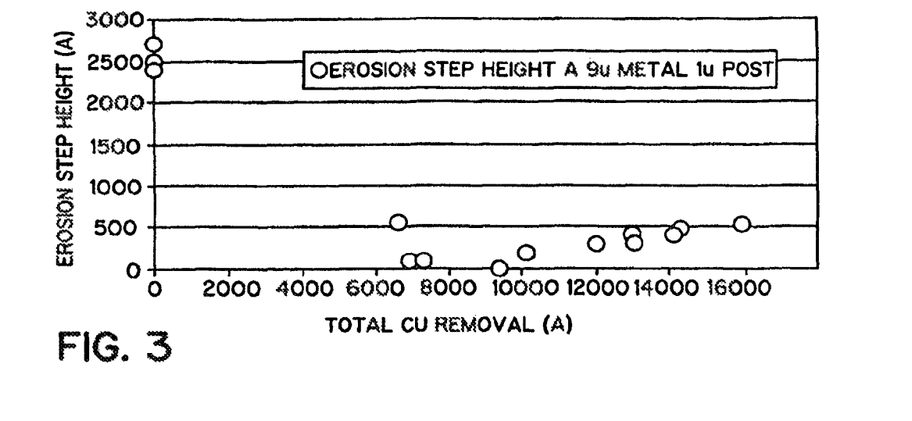
FIG. 3 is a graph of erosion step height relative to total copper removal for the same composition evaluated in FIG. 2.

Data generated using formula 2 for the cumulative total amount of copper removed on an equivalent die location basis on blanket copper films polished under identical conditions as for each patterned wafer polish and the erosion step height magnitude at center, mid radius and edge die locations for the erosion evaluation are set out in Table 6. The data points were used to generate the graph as shown in FIG. 3.

TABLE 5

Dishing Step Height Evaluation (Formula 2)

| Die Location | Total Copper Removed From Die (Å) | Dishing Step Height (100μ × 100μ) (Å) |
|---|---|---|
| Center Die | 0 | 6000 |
| | 6934 | 200 |
| | 9459 | 0 |
| | 12000 | 600 |
| | 13064 | 900 |
| Middle Die | 0 | 6250 |
| | 7321 | 100 |
| | 10178 | 0 |
| | 13025 | 600 |
| | 14109 | 1150 |
| Edge Die | 0 | 6250 |
| | 6593 | 100 |
| | 10180 | 400 |
| | 14284 | 1650 |
| | 15888 | 1900 |

TABLE 6

Erosion Step Height Evaluation (Formula 2)

| Die Location | Total Copper Removed From Die (Å) | Erosion Step Height (9μ Metal 1μ Post) (Å) |
|---|---|---|
| Center Die | 0 | 2700 |
| | 6934 | 100 |
| | 9459 | 0 |
| | 12000 | 275 |
| | 13064 | 300 |
| Middle Die | 0 | 2400 |
| | 7321 | 100 |
| | 10178 | 175 |
| | 13025 | 400 |
| | 14109 | 400 |
| Edge Die | 0 | 2500 |
| | 6593 | 550 |
| | 10180 | 175 |
| | 14284 | 450 |
| | 15888 | 500 |

Figure 4:
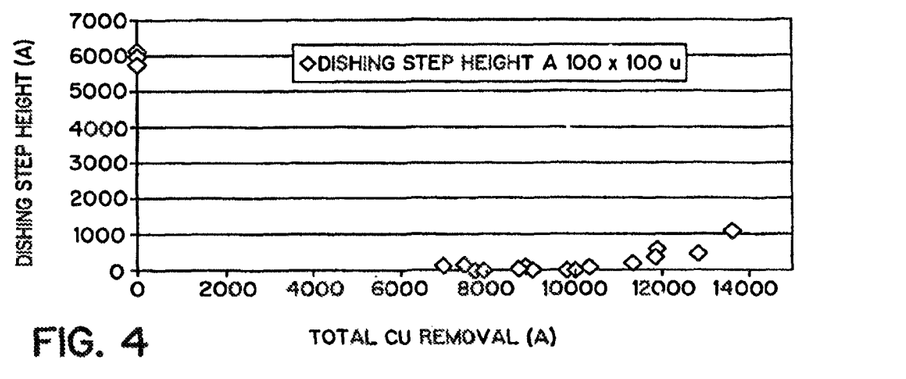
FIG. 4 is a graph of dishing step height relative to total copper removal for an alternate CMP composition.
Figure 5:
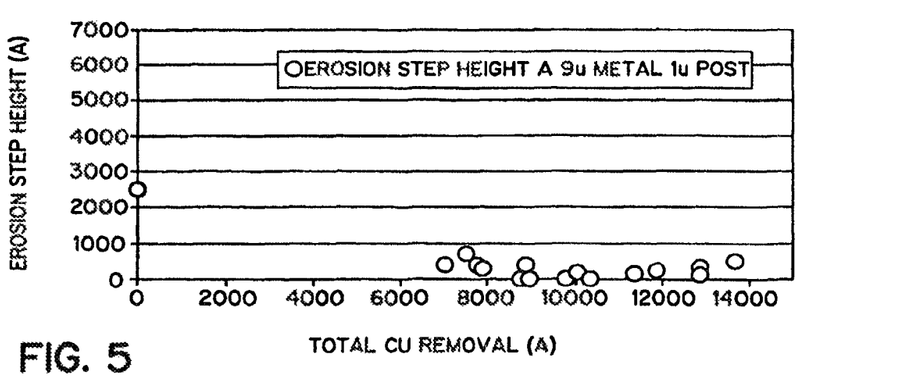
FIG. 5 is a graph of erosion step height relative to total copper removal for the same composition evaluated in FIG. 4.

In a separate test, formula 3A was prepared comprising 35 ppm colloidal silica of the type identified above in Example 1, 0.35% aminoacetic acid, 175 ppm 1,2,4-triazole, 1% hydrogen peroxide and the balance deionized water. This formula was evaluated for dishing effect using the SEMATECH 854AZ patterned wafer. Planarization was conducted using the OP-II CMP protocol above. The wafer was then analyzed for dishing effects at the center, middle, and edge die locations. Data generated using formula 3A for the total amount of copper removed and the dishing step height for the dishing evaluation are set out in Table 7 below. The data points were used to generate the graph as shown in FIG. 4. Data generated using formula 3A for the total amount of copper removed and the erosion step height at center, middle and edge die locations for the erosion evaluation are set out in Table 8 below. The data points were used to generate the graph as shown in FIG. 5.

TABLE 7

Dishing Step Height Evaluation (Formula 3A)

| Die Location | Total Copper Removed From Die (Å) | Dishing Step Height (100μ × 100μ) (Å) |
|---|---|---|
| Center Die | 0 | 5700 |
|  | 6999 | 150 |
|  | 7946 | 0 |
|  | 8969 | 0 |
|  | 10357 | 125 |
|  | 11862 | 375 |
| Middle Die | 0 | 6000 |
|  | 7748 | 0 |
|  | 8763 | 0 |
|  | 9782 | 0 |
|  | 11342 | 200 |
|  | 12869 | 475 |
| Edge Die | 0 | 6100 |
|  | 7500 | 150 |
|  | 8887 | 150 |
|  | 10010 | 0 |
|  | 11897 | 600 |
|  | 13638 | 1100 |

TABLE 8

Erosion Step Height Evaluation (Formula 3A)

| Die Location | Total Copper Removed From Die (Å) | Erosion Step Height (9μ Metal 1μ Post) (Å) |
|---|---|---|
| Center Die | 0 | 2500 |
|  | 6999 | 400 |
|  | 7946 | 300 |
|  | 8969 | 0 |
|  | 10357 | 0 |
|  | 11862 | 150 |
| Middle Die | 0 | 2500 |
|  | 7748 | 400 |
|  | 8763 | 0 |
|  | 9782 | 0 |
|  | 11342 | 175 |
|  | 12869 | 325 |
| Edge Die | 0 | 2500 |
|  | 7500 | 750 |
|  | 8887 | 200 |
|  | 10010 | 200 |
|  | 11897 | 250 |
|  | 13638 | 500 |

In evaluating the topography evolution during polishing on the as-plated 854AZ patterned wafer, the amount of copper removal was measured on a blanket copper plated film polished under otherwise identical conditions. This amount of copper removal was measured by a 4-point probe but using the five Tencor RS35c measurements which correspond to the equivalent die location on the patterned wafer. The cumulative amount of copper removed in each sequential polish was compared with the height difference of material in the feature of interest relative to the height of material just outside the feature of interest, in absolute terms. For a dishing effect evaluation, the height of the copper in a trench was compared to the adjacent height of material just outside the trench. The trench width was 100 tan. For an erosion effect evaluation, the maximum height of material at the middle of the 90% metal density array is compared to the height of material just outside the array. The width of copper lines relative to the adjacent silica lines was 9 Am to 1 μm. For both the dishing and erosion effect evaluations, the process started with significant as-plated topography. The copper removal process reached a point wherein the copper in the feature was at substantially the same height as the copper on the surrounding surface, thus essentially achieving a state without topography but with remaining copper overburden. Continued polishing then began to clear copper overburden and remove copper inside the trench feature relative to material outside the trench on the surrounding wafer, and the absolute value of this difference in height appeared on the graphs shown in FIGS. 2, 3, 4 and 5. The build-up of topography during this clearing process generally increased in a linear fashion with the extent of total amount of copper removed. The slope of the topography build-up relative to the copper removed is termed the dishing or erosion susceptibility for the structure of interest and can be used as a performance metric. This susceptibility value is dimensionless. The lower the value of slope, the lower the amount of topography at any given amount of copper removed and the better the performance. For the data from Tables 5 and 6 the magnitude of 100 gm wide line dishing susceptibility was approximately 0.29 as shown in FIG. 2 and the magnitude of 90% metal density erosion susceptibility was approximately 0.07 as shown in FIG. 3. For the data from Tables 7 and 8, the corresponding magnitudes of dishing and erosion susceptibilities for formula 3A were 0.2 and 0.097 respectively, as shown in FIGS. 4 and 5 respectively. Both dishing and erosion susceptibilities were determined by a least squares fit on the data points of the overpolishing portion of the graphs. The formulas described were used with the OP-II test protocol. The run times were varied over the course of the evaluation. Sequential polish times of 60 sec, 30 sec, 30 sec, and 30 sec were used for the formula 2 evaluation. Sequential polish times of 60 sec, 60 sec, 30 sec, 30 sec, 40 sec and 40 sec were used for the formula 3A evaluation, with the interval between the start point (0 A copper removed) and the next data entry receiving two polish times of 60 seconds each.

Example 2

The ability of different particulate substances in the composition to enhance the copper removal rate was evaluated. A single formulation composition as set out in Table 9 below was used to evaluate various particulate materials.

The individual formulas were prepared by first blending aminoacetic acid, 1,2,4-triazole and water, then adding in the specific particulate material generally in the form of a pre-dispersion or other water-containing flowable form from the manufacturer; or alternatively directly from the powder or as a homogeneous laboratory-prepared mixture of powder and water optionally containing small amounts of stabilizing additive.

TABLE 9

| Component | Concentration |
|---|---|
| $H_2O_2$ | 1% |
| Aminoacetic Acid | 1% |
| 1,2,4-Triazole | 500 ppm |
| Particulate Material | 0.1% |
| Deionized Water | Balance |

Various formulations were developed by substituting different particles and evaluating the rates of removal. The CMP protocol described in Example 1 (OP-I) was utilized for a one minute run time for formulas 12, 13 and 14 below. The copper film removal rate was measured using a Tencor RS35c 4-point probe. Each particulate material for this series of runs was compounded into the respective formulas from the powder form, and mean particle sizes were generated using the Accusizer measurement equipment described above.

The fumed silica was mixed in the laboratory with deionized water sufficient to prepare a 20% suspension by weight, with addition of about 255 ppm phosphoric acid. NH4OH was also incorporated to adjust the final pH to approximately 7. The mixture was agitated using a homogenizer for about 10 minutes. The aluminum oxide powder was combined in the laboratory with deionized water sufficient to prepare an 18% solids pre-dispersion with addition of about 750 ppm phosphoric acid. No further pH adjustment was employed. The mixture was agitated using a homogenizer for about 10 minutes. The titanium dioxide was pre-dispersed in deionized water to produce a 10% solids suspension. 300 ppm H3PO4 was introduced into the mixture, and NH4OH was added as necessary to adjust the pH to approximately 7. The mixture was agitated using a homogenizer for 10 minutes. In all cases the oxidizer was added after the other components were combined. The formula number, particulate material utilized in the formulation and copper rates of removal are provided below in Table 10 for fumed silica, fumed aluminum oxide, and titanium dioxide. The rate of removal measurement set out in Example 1 was used.

TABLE 10

| Formula No. | Particulate Material | Cu RR (Å/Min.) |
|---|---|---|
| 12 | Fumed $SiO_2$ [1] | 8984 |
| 13 | Fumed $Al_2O_3$ [2] | 4501 |
| 14 | $TiO_2$ [3] | 7963 |

[1] Aerosil 90 Product, 250 nm particle size, available from Degussa Corp., New Jersey
[2] Aluminium Oxid C Product. 300 rim, available from Degussa Corp., New Jersey
[3] Titan Dioxid P25. 300 nm, available from Degussa Corp., New Jersey A separate group of runs on additional compositions of particulate materials was generated using another CMP protocol identified as OP-III with a one minute run time. The relevant parameters were as follows:

OP-III

Down Force on the Carrier: 2.8 psi
Backfill Pressure: 2 psi
Platen Speed: 150 rpm
Carrier Speed: 30 rpm
Pad Type: IC 1000 S-IV (Rode Inc., Phoenix Ariz. 85034)
Pad Conditioning: 1591 g. 5.08 cm (Morgan Advanced Ceramics Inc., Diamine Division, Allentown, Pa.), 75 IA, grid pad, in situ
Slurry Flow Rate: 150 ml/min The formulas containing the additional particulate materials used in the OP-III protocol produced copper rate of removal data which are set out below.

The CeO2 was introduced with agitation into the combination of aminoacetic acid, 1,2,4-triazole and water as a commercially prepared slurry. The polystyrene latex spheres were introduced into the combination of aminoacetic acid, 1,2,4-triazole and water with mechanical stir bar agitation for about 10 minutes. The formulas containing kaolin and mica powders were prepared in similar manner to the formula containing polystyrene latex spheres. In all cases the oxidizer was added after the other components were combined. The rate of removal measurement set out in Example 1 was used.

TABLE 10A

| Formula No. | Particulate Material | Cu RR (Å/Min.) |
|---|---|---|
| 15 | $CeO_2$ [1] | 4160 |
| 16 | Polystyrene Latex [2] | 4585 |
| 17 | Kaolin [3] | 3711 |
| 18 | Mice | 3036 |

[1] Particle size 250 nm, 17.7% slurry, available from Nanophase Materials. Illinois
[2] Particle size 1 p, available from Poly Sciences Inc.. Illinois
[3] Particle size 0.3 p. available from Engelhard, New Jersey
[4] Particle size 3-10 p, available from E M Industries, New York The copper rate of removal results in Tables 10 and 10A demonstrate the effectiveness of formulations containing a variety of particle compositions. It should be noted that good rates of removal were observed using materials such as kaolin and mica, which have a particulate structure distinct from that of silica and alumina.

Example 3

The use of other amino acids in addition to aminoacetic acid was evaluated. Various formulations containing components identical but for the amino acid were prepared, having a base composition as 'shown below in Table 11. The colloidal silica was the same as that described previously in Example 1. The test solutions were prepared by dissolving the desired amount of amino acid and 1,2,4-triazole in deionized water in an open container. To this solution was added the colloidal silica. The solution containing the colloidal silica was homogenized by physical agitation using a stirring rod for several minutes before adding $H_2O_2$ as the oxidizer.

TABLE 11

| Component | Concentration |
|---|---|
| $H_2O_2$ | 1% |
| Amino Acid | 2% |
| 1,2,4-Triazole | 500 ppm |
| Colloidal $SiO_2$ | 0.1% |
| Deionized Water | Balance |

The formulation numbers and particular amino acids used in each of the formulations are listed below in Table 12. Table 12 lists the formula number, the particular amino acid used and the rate of removal of the copper for a one minute run as measured using a Tencor RS35c 4-point probe. The OP-III CMP protocol described in Example 2 was used, and the rate of removal measurement set out in Example 1 was used.

TABLE 12

| Formula No. | Amino Acid | Cu RR (Å/Min.) |
|---|---|---|
| 19 | Serine | 8267 |
| 20 | Lysine | 1906 |
| 21 | Glutamine | 5650 |
| 22 | L-alanine | 5588 |
| 23 | DL-alanine | 5739 |
| 24 | Iminoacetic Acid | 1945 |
| 25 | Asparagine | 4260 |
| 26 | Aspartic Acid | 2787 |
| 27 | Valine | 1977 |
| 28 | Sarcosine | 5852 |

In the above formulations no pH adjustment was required except for formulation 24 containing iminoacetic acid, with which NH$_4$OH was used to adjust the pH to 7. The pH for the remaining formulations fell within a range of 5.5 to 7.3.

Example 4

The effective range of pH for the CMP formulas was also evaluated. Three aqueous mixtures comprised of 1% H$_2$O$_2$, 1% aminoacetic acid, 500 ppm of 1,2,4-triazole, and 0.1% colloidal SiO2 of the type described in Example 1 above were prepared. The initial pH values were all 6.6. One portion (formula 30) was retained at this pH. Ammonia solution was incorporated into a separate portion of the original composition to adjust this sample (formula 31) to a pH of 9. Citric acid was incorporated into a separate portion to adjust this sample (formula 29) to a pH of 3.5. The OP-HI CMP protocol described in Example 2 was used for a one minute run time, and the copper rate of removal measurement set out in Example 1 was used. The test results are set out below in Table 13.

TABLE 13

| Formula No. | pH | Cu RR (Å/Min.) |
|---|---|---|
| 29 | 3.5 | 2281 |
| 30 | 6.6 | 7229 |
| 31 | 9.0 | 3109 |

Acceptable rate of removal results were observed to be obtained over a range of pH values.

Example 5

The effect of copper rate of removal relative to the change in concentration of the particulate material alone in the formula was also evaluated. A single base formulation for this example was developed having the components and concentration values listed in Table 14 below.

TABLE 14

| Component | Concentration |
|---|---|
| H$_2$O$_2$ | 1% |
| Aminoacetic Acid | 1% |
| 1,2,4-Triazole | 500 ppm |
| Colloidal SiO$_2$ | Various loading levels |
| Deionized Water | Balance |

The formulations below were prepared utilizing different concentrations of colloidal silica and the copper rate of removal was measured. The colloidal silica was that previously described in Example 1. The OP-III CMP protocol described in Example 2 was used for a one minute run time, and the rate of removal measurement set out in Example 1 was used. The test solutions were prepared by dissolving the desired amount of amino acid and 1,2,4-triazole in deionized water in an open container. To this solution was added the colloidal silica. The solution containing the colloidal silica was homogenized by physical agitation using a stirring rod for several minutes before adding H$_2$O$_2$ as the oxidizer. Table 15 below shows the various formulations, colloidal silica loading levels, and copper removal rates.

TABLE 15

| Formula No. | SiO$_2$ (ppm) | Cu RR (Å/Min.) |
|---|---|---|
| 32 | 0 | 1661 |
| 33 | 5 | 5531 |
| 34 | 10 | 6175 |
| 35 | 35 | 4822 |
| 36 | 1000 | 7229 |

Substantial increases in copper rate of removal were observed in formulas having even very low levels of colloidal silica relative to the formula containing no added colloidal silica.

Example 6

The ability of a formulation to be diluted was also evaluated. Formula 37, set out below in Table 16, was initially prepared as a concentrate but without the H$_2$O$_2$ oxidizer and then diluted with 40 volumes of water sufficient to create a solution having the same component concentrations as formula 38, also set out in Table 16. Formula 38 was separately prepared having the component concentrations appearing in Table 16. The test solutions were prepared by dissolving the desired amount of amino acid and 1,2,4-triazole in deionized water in an open container. To this solution was added the colloidal silica. The solution containing the colloidal silica was homogenized by physical agitation using a stirring rod for several minutes. H$_2$O$_2$ as the oxidizer was added only to formula 37 after the dilution with water to form the solution as actually tested.

The OP-III protocol set out in Example 2 was used to evaluate the copper rate of removal for formulas 37 and 38 using a one minute run time. Rate of removal was measured using a Tencor RS35c 4-point probe, and the rate of removal measurement set out in Example 1 was used. The copper rates of removal are set out below in Table 16 for formula 38 prepared with normal dilution of water, and from the concentrate (formula 37) with subsequent dilution. For comparison, formula 2 was also prepared as a concentrate, shown below as formula 39, but without the H$_2$O$_2$ as the oxidizer and the formula prepared as set out above. This formula 39 was then diluted with 10 volumes of water sufficient to create a solution having the same component concentrations as formula 2, also set out below. Formula 2 was separately prepared having the component concentrations which appear in Table 16. H$_2$O$_2$ as the oxidizer was added only to formula 39 after the dilution with water to form the solution as actually tested. A modified protocol (OP-IV) set out below was used to evaluate the copper rate of removal for diluted formula 39 and formula 2 using a one minute run time.

OP-IV

Down Force on the Carrier: 2 psi
Backfill Pressure: 1.5 psi
Platen Speed: 50 rpm
Carrier Speed: 30 rpm
Pad Type: IC 1000 S-IV (Rode Inc., Phoenix Ariz. 85034)
Pad Conditioning: 1591 g. 5.08 cm (Morgan Advanced Ceramics Inc., Diamine Division, Allentown, Pa.), 75 IL grid pad, in situ
Slurry Flow Rate: 150 ml/min Rate of removal was measured using a Tencor RS35c 4-point probe, and the rate of removal measurement set out in Example 1 was used. The copper rates of removal are also set out below in Table 16 for formula 2 prepared with normal dilution of water, and from the concentrate (formula 39) with subsequent dilution.

TABLE 16

| Component | Formula 37 | Formula 38 | Formula 39 | Formula 2 |
|---|---|---|---|---|
| $H_2O_2$ | —* | 1% | —* | 1% |
| Aminoacetic | 14% | 0.35% | 10% | 1% |
| 1,2,4-Triazole | 7000 | 175 | 5000 | 500 |
| $SiO_2$ (ppm) | 1400 | 35 | 10000 | 1000 |
| Deionized | Balance | Balance | Balance | Balanc |
| Cu RR (at same level of Protocol | 3223 OP-III | 3346 OP-III | 3661 OP-IV | 3284 OP-IV |

*1% $H_2O_2$ added to the final, diluted solution

As can be seen from the above examples, the formulas and methods set out above demonstrate the ability of CMP formulations containing low concentrations of particulate material to effectively remove copper-containing material deposited on the surface of a wafer down to a stop layer without substantial removal of the stop layer. The formulas and methods can be practiced over a range of pH conditions using a range of component materials, and can further be practiced using dilutions of formula concentrate without adverse effect.

Thus it is apparent that there has been provided, in accordance with the invention, CMP formulas and methods of planarization utilizing the formulas which fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, departures may be made from such details without departing from the spirit or scope of the general inventive concept.

The invention claimed is:

1. A composition for use in removing copper from a surface of a wafer containing the copper laying above a stop layer consisting essentially of:
   1) an oxidizing agent;
   2) about 0.05% to about 5% by weight an amino acid selected from the group consisting of aminoacetic acid, serine, glutamine, L-alanine, DL-alanine, iminoacetic acid, asparagine, aspartic acid, valine, sarcosine, and mixtures thereof;
   3) about 5 ppm to less than 700 ppm by weight particulate material selected from the group consisting of fumed silica, colloidal silica, fumed alumina, colloidal alumina, cerium oxide, titanium dioxide, zirconium oxide, polystyrene, polymethyl methacrylate, mica, hydrated aluminum silicate, and mixtures thereof;
   4) at least one corrosion inhibitor; and
   5) water;
wherein
   the particulate material has a particle size in the range of about 4 nm to about 10,000 nm; and
   the composition facilitates removal of copper from the wafer surface while maintaining a rate of removal of copper to stop layer of at least 50:1.

2. The composition of claim 1 wherein the oxidizing agent is hydrogen peroxide and the amino acid is aminoacetic acid.

3. The composition of claim 1 wherein the particulate material is selected from the group consisting of polystyrene, polymethyl methacrylate, mica, hydrated aluminum silicate, and mixtures thereof.

4. The composition of claim 1 having a pH in a range between about 3.5 and about 9.

5. The composition of claim 1 having a pH of about 6.6 and the particulate material has a concentration in the range of about 5 ppm to about 400 ppm.

6. The composition of claim 1, wherein the corrosion inhibitor selected from the group consisting of 1,2,3-triazole; 1,2,4-triazole; 4-amino-4H-1,2,4-triazole; benzotriazole; 1,2,3-benzotriazole; 5-methylbenzotriazole; I-hydroxybenzotriazole; 4-hydroxybenzotriazole and combinations thereof.

7. The composition of claim 6 wherein the oxidizing agent is hydrogen peroxide; the amino acid is aminoacetic acid; and the corrosion inhibitor is 1,2,4-triazole.

8. A composition for use in removing copper from a surface of a wafer containing the copper laying above a stop layer consisting of:
   hydrogen peroxide;
   about 0.05% to about 5% by weight at least one amino acid selected from the group consisting of aminoacetic acid, serine, glutamine, L-alanine, DL-alanine, iminoacetic acid, asparagine, aspartic acid, valine, sarcosine, and mixtures thereof;
   about 5 ppm to about 700 ppm by weight particulate material selected from the group consisting of fumed silica, colloidal silica, fumed alumina, colloidal alumina, cerium oxide, titanium dioxide, zirconium oxide, polystyrene, polymethyl methacrylate, mica, hydrated aluminum silicate, and mixtures thereof;
   about 0.05% to about 5% by weight a corrosion inhibitor selected from the group consisting of 1,2,3-triazole; 1,2,4-triazole; 4-amino-4H-1,2,4-triazole; benzotriazole; 1,2,3-benzotriazole; 5-methylbenzotriazole; 1-hydroxybenzotriazole; 4-hydroxybenzotriazole and combinations thereof; and
   water;
   wherein the particulate material has a particle size in the range of about 4 nm to about 1000 nm;
   the composition has a pH in a range between about 3.5 and about 9; and
   the composition facilitates removal of the copper from the wafer surface while maintaining a rate of removal of copper to stop layer of at least 50:1.

9. The composition of claim 8 wherein the amino acid is aminoacetic acid.

10. The composition of claim 8 wherein the particulate material is selected from the group consisting of polystyrene, polymethyl methacrylate, mica, hydrated aluminum silicate, and mixtures thereof.

11. The composition of claim 8 wherein the composition maintains a rate of removal of copper to stop layer of at least 100:1.

12. The composition of claim 8 having a pH of about 6.6 and the particulate material has a concentration in the range of about 5 ppm to about 400 ppm.

13. The composition of claim 8 having a pH of about 6.6 and the particulate material has a concentration in the range of about 5 ppm to about 100 ppm.

14. The composition of claim 8 wherein the particulate material has a particle size in the range of about 4 nm to about 400 nm.

15. A chemical mechanical planarization (CMP) system for polishing a wafer, comprising
1) the wafer having at least one surface comprising copper laying above a stop layer;
2) a polishing pad;
3) a CMP composition consisting essentially of:
a) an oxidizing agent;
b) about 0.05% to about 5% by weight at least one amino acid selected from the group consisting of aminoacetic acid, serine, glutamine, L-alanine, DL-alanine, iminoacetic acid, asparagine, aspartic acid, valine, sarcosine, and mixtures thereof;
c) about 5 ppm to about 700 ppm by weight particulate material selected from the group consisting of fumed silica, colloidal silica, fumed alumina, colloidal alumina, cerium oxide, titanium dioxide, zirconium oxide, polystyrene, polymethyl methacrylate, mica, hydrated aluminum silicate, and mixtures thereof;
d) about 0.05% to about 5% by weight a corrosion inhibitor selected from the group consisting of 1,2,3-triazole; 1,2,4-triazole; 4-amino-4H-1,2,4-triazole; benzotriazole; 1,2,3-benzotriazole; 5-methylbenzotriazole; 1-hydroxybenzotriazole; 4-hydroxybenzotriazole and combinations thereof; and
e) water;
wherein the particulate material has a particle size in the range of about 4 nm to about 1000 nm;
the composition has a pH in a range between about 3.5 and about 9; and
the composition facilitates removal of the copper from the surface of the wafer while maintaining a rate of removal of copper to stop layer of at least 50:1;
wherein the copper is in contact with the polishing pad and the CMP composition; and the CMP composition facilitates removal of copper while maintaining a rate of removal of copper to stop layer of at least 50:1.

16. The system of claim 15 wherein the oxidizing agent is hydrogen peroxide and the amino acid is aminoacetic acid.

17. The system of claim 15 wherein the particulate material is selected from the group consisting of polystyrene, polymethyl methacrylate, mica, hydrated aluminum silicate, and mixtures thereof.

18. The system of claim 15 having a pH in a range between about 3.5 and about 9.

19. The system of claim 15 having a pH of about 6.6 and the particulate material has a concentration in the range of about 5 ppm to about 400 ppm.

20. The composition of claim 15 wherein the oxidizing agent is hydrogen peroxide; the amino acid is aminoacetic acid; and the corrosion inhibitor is 1,2,4-triazole.

\* \* \* \* \*